(12) United States Patent
Zito et al.

(10) Patent No.: US 8,905,791 B2
(45) Date of Patent: Dec. 9, 2014

(54) SINGLE LAYER LEADFRAME WITH INTEGRATED THREE-ROW CONNECTOR

(71) Applicant: Continental Automotive Systems, Inc., Auburn Hills, MI (US)

(72) Inventors: Donald J Zito, Fox River Grove, IL (US); Valentin M Stefaniu, Lake Zurich, IL (US); Gabriel Tirlea, Niles, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 63 days.

(21) Appl. No.: 13/768,415

(22) Filed: Feb. 15, 2013

(65) Prior Publication Data

US 2014/0235076 A1    Aug. 21, 2014

(51) Int. Cl.
    *H01R 12/00*    (2006.01)
    *H01R 12/70*    (2011.01)
    *B60T 8/36*    (2006.01)
    *G06F 1/18*    (2006.01)
    *H01R 9/22*    (2006.01)
    *H05K 5/02*    (2006.01)
    *H05K 7/02*    (2006.01)

(52) U.S. Cl.
    CPC . *H01R 12/70* (2013.01); *B60T 8/36* (2013.01); *G06F 1/18* (2013.01); *H01R 9/226* (2013.01); *H05K 5/02* (2013.01); *H05K 7/02* (2013.01)
    USPC .......................................... 439/638; 439/76.1

(58) Field of Classification Search
    USPC ................................................ 439/76.1, 638
    See application file for complete search history.

(56) References Cited

U.S. PATENT DOCUMENTS

| 4,395,084 | A | * | 7/1983 | Conrad ........................ 439/331 |
| 4,449,165 | A |  | 5/1984 | Kaufman |
| 4,820,192 | A | * | 4/1989 | Denkmann et al. .......... 439/404 |
| 5,406,450 | A | * | 4/1995 | Shieh ....................... 361/679.37 |
| 6,485,112 | B1 | * | 11/2002 | Haller ........................ 303/119.2 |
| 7,473,107 | B2 |  | 1/2009 | Ice |
| 7,540,747 | B2 | * | 6/2009 | Ice et al. ........................ 439/79 |
| 7,756,610 | B2 | * | 7/2010 | Laurent et al. ................ 700/302 |
| 8,149,594 | B2 | * | 4/2012 | Nishihata ..................... 361/818 |
| 8,375,901 | B2 | * | 2/2013 | Krajowsky et al. .......... 123/60.1 |
| 2003/0176109 | A1 | * | 9/2003 | Fukuchi et al. .............. 439/638 |
| 2004/0043660 | A1 | * | 3/2004 | Brown et al. ................ 439/608 |
| 2004/0187942 | A1 | * | 9/2004 | Ford et al. .................... 137/884 |
| 2007/0184722 | A1 | * | 8/2007 | Doherty ....................... 439/638 |
| 2009/0142940 | A1 | * | 6/2009 | Ikeda .......................... 439/76.2 |
| 2009/0223468 | A1 | * | 9/2009 | Smith et al. ................ 123/90.13 |
| 2010/0035454 | A1 | * | 2/2010 | Morgan et al. ............... 439/296 |
| 2010/0048058 | A1 | * | 2/2010 | Morgan et al. .......... 439/607.05 |
| 2010/0105251 | A1 | * | 4/2010 | Hiew et al. .................... 439/638 |
| 2011/0089546 | A1 |  | 4/2011 | Bayan |

* cited by examiner

*Primary Examiner* — Gary Paumen

(57) ABSTRACT

A lead frame assembly having a lead frame made of a single layer, a housing substantially surrounding the lead frame, and a plurality of leads formed as part of the lead frame. The lead frame assembly also includes a plurality of interfaces, allowing various devices to interact with the lead frame, such as sensors, thermistors, solenoids, engine controllers, or electronic control units, or the like. The interfaces may be formed as part of the lead frame, oriented in different directions, and may be located in different planes, making the lead frame assembly suitable for applications with different packaging requirements. The interfaces may be a plurality of connectors, where at least one of the plurality of connectors are disposed in the same plane as the lead frame, and another of the plurality of connectors is disposed in a different plane from the lead frame.

18 Claims, 1 Drawing Sheet

SINGLE LAYER LEADFRAME WITH INTEGRATED THREE-ROW CONNECTOR

FIELD OF THE INVENTION

The invention relates generally to a lead frame having a single row with multiple connectors.

BACKGROUND OF THE INVENTION

Lead frames are commonly used to provide electrical communication between various electrical components. The lead frame typically includes metal leads which extend outside of a housing for providing a connection between various components.

Lead frames also may include a connector, which is mounted to the housing, for providing electronic communication between the lead frame and other devices. There are also applications where is it necessary to have multiple connectors either formed as part of the lead frame, or attached to the lead frame. One type of a design incorporates the use of a lead frame having multiple layers, to provide for the use of multiple connectors. These multiple layer lead frames are typically constructed using a housing surrounding the multiple layers, with the multiple layers being separated by a portion of the housing. However, since the housing is typically made of a plastic material, during the operation of the multiple layer lead frame, heat generated may cause the plastic material to shift or deform. This may result in two or more of the multiple layers of the lead frame contacting one another, increasing the potential for shorting the electrical connection between the layers. Additionally, lead frames having multiple layers are more expensive to manufacture because of the multiple pre-molds required for the additional layers.

Accordingly, there exists a need for a lead frame which allows for the use of multiple connectors, while remaining cost feasible to manufacture.

SUMMARY OF THE INVENTION

The present invention is a lead frame assembly having a lead frame made of a single layer, a housing substantially surrounding the lead frame, and a plurality of leads formed as part of the lead frame. The lead frame assembly also includes a plurality of interfaces, which allow various components or devices to interact with the lead frame. The interfaces may be formed as part of the lead frame, and be oriented in different directions, allowing for various devices to be connected to and communicate with the lead frame. In some embodiments, the interfaces may be located in different planes, making the lead frame assembly suitable for applications with different packaging requirements.

In one embodiment, the interfaces are a plurality of connectors, having a plurality of pins, where at least one of the plurality of connectors are disposed in the same plane as the lead frame, and another of the plurality of connectors is disposed in a different plane from the lead frame.

The connectors further include a first connector connected to the lead frame, a second connector connected to the lead frame in proximity to the first connector, and a third connector connected to the lead frame in proximity to the first connector and the second connector. The lead frame, the first connector, the second connector, and the third connector are located in a first plane. Also included is a fourth connector connected to the lead frame, a fifth connector connected to the lead frame in proximity to the fourth connector, where the fourth connector and fifth connector are disposed in a second plane, the second plane being different from the first plane.

The plurality of connectors also includes a sixth connector extending outwardly away from the lead frame, such that the sixth connector extends away from the first plane. The plurality of connectors further includes a seventh connector disposed in the first plane, where the seventh connector faces a different direction compared to the first connector, the second connector, and the third connector.

The lead frame assembly also includes a plurality of leads connected to the lead frame, wherein each of the plurality of leads is connected to a solenoid.

It is an object of this invention to provide a lead frame assembly which may be used with several different devices, such as, but not limited to sensors, thermistors, solenoids, engine controllers, or electronic control units, or any other device suitable for connection with a lead frame using one or more interfaces. In one embodiment, the interfaces are located in different planes, allowing for the connection to the lead frame to be in different planes.

It is another object of this invention to provide a lead frame having a single layer to incorporate a three row connector system. In one embodiment, the additional third row is added to the center of a dual row connector. This third center row is comprised of a separate lead frame coming from the bottom side of the two row system.

It is another object of this invention to provide a three row connector incorporated into a single layer lead frame. This provides a cost effective solution for two-row connectors and potential expansion to three-row connectors at minimal costs. The lead frame assembly of the present invention also expands the connector ports and interconnectors on the lead frame. Connectors having a low pin count are used with the basic lead frame, while connectors having a high pin count may add expansion to the lead frame and add a third row.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
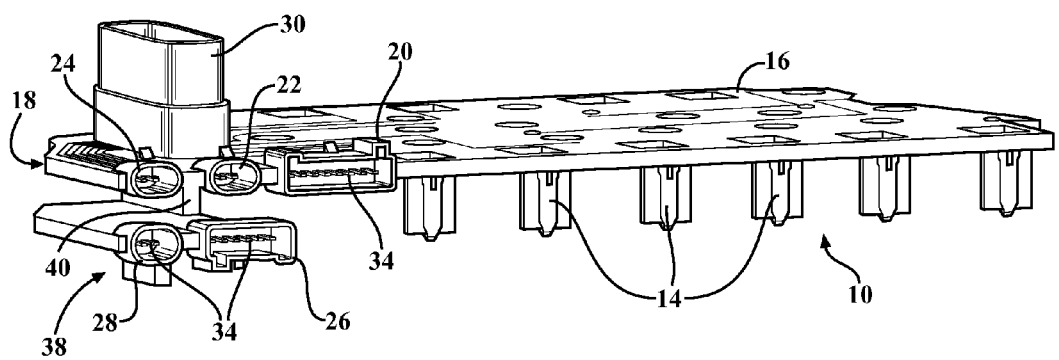
FIG. 1 is a perspective view of a lead frame having multiple connectors, according to embodiments of the present invention.
Figure 2:
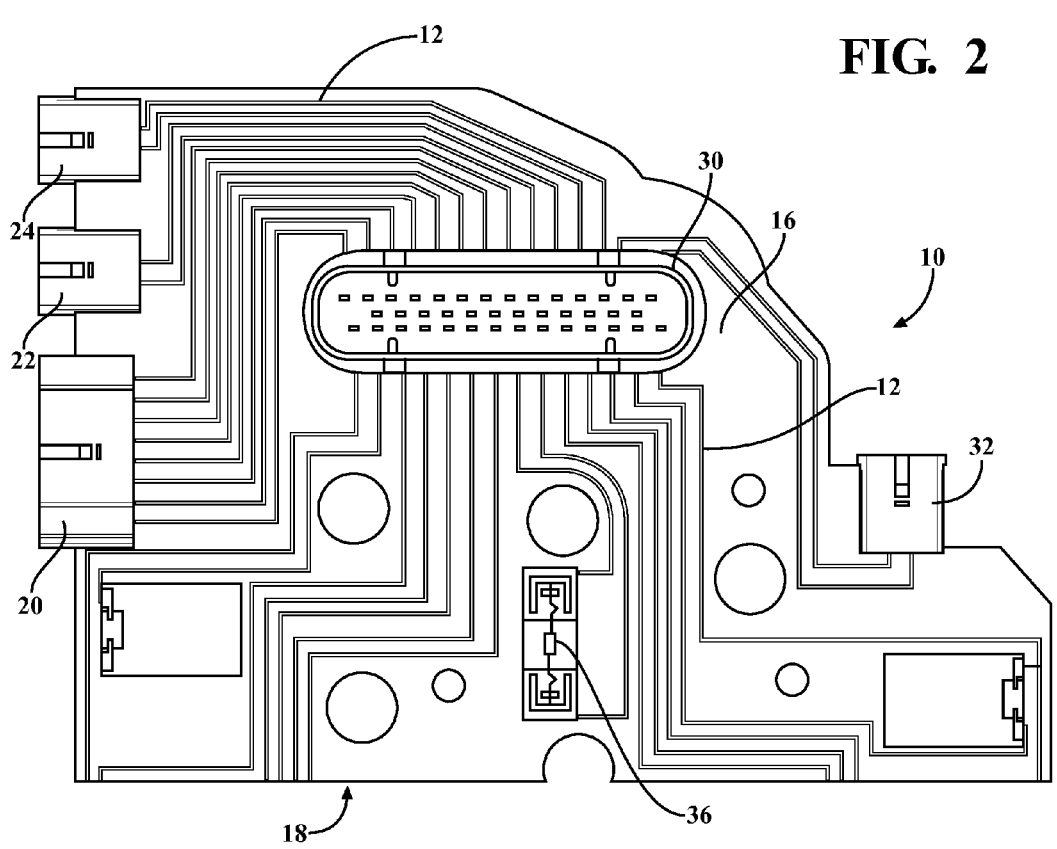
FIG. 2 is a top view of a portion of a lead frame having multiple connectors, according to embodiments of the present invention.

An embodiment of a lead frame assembly according to the present invention is shown in FIGS. 1-2 generally at 10. The lead frame assembly 10 includes a frame portion, or lead frame, 12 having a plurality of leads 14. The lead frame 12 and leads 14 are at least partially surrounded by a housing 16. The housing 16 is molded around the lead frame 12 and leads 14, and is made of a plastic moldable material, such as epoxy, nylon, polyethylene, or polystyrene.

The lead frame 12 is made of a single layer, shown generally at 18, where the single layer 18 defines a first plane. Integrally formed as part of the housing 16 is more than one interface. Each interface is used for allowing communication as well as a connection with the lead frame 12. In this embodiment, the plurality of interfaces is a plurality of connectors. However, other types of interfaces may be used to allow the lead frame 12 to be used with different devices, such as, but not limited to, thermistors, solenoids, sensors, or the like. Furthermore, the other devices, such as the sensors, thermistors, solenoids, engine controllers, or electronic control units, may be directly connected to the lead frame 12, and in other embodiments, the other devices may be integral with the lead frame 12.

In the embodiment shown in FIGS. 1-2, there is a first connector 20, a second connector 22, and a third connector 24 formed as part of the housing 16, and the connectors 20,22,24 and layer 18 are located in the first plane. There is also a fourth connector 26 and a fifth connector 28 connected to the lead frame 12, and the housing 16 partially surrounds the fourth connector 26 and the fifth connector 28. The fourth connector 26 and fifth connector 28 are located in a second plane which is substantially parallel to and separate from the first plane. In this embodiment, the fourth connector 26 and fifth connector 28 are located below the connectors 20,22,24. A sixth connector, which in this embodiment is an upper connector 30, is also connected to the lead frame 12, and is at least partially surrounded by the housing 16. The sixth connector 30 faces and extends outwardly away from the lead frame 12, as shown in FIGS. 1 and 2. There is also a seventh connector 32, which is shown in FIG. 2 connected to the opposite side of the lead frame 12 as the connectors 20,22,24, but the seventh connector 32 is still located in the first plane.

Each of the connectors 20,22,24,26,28,30 also includes one or more pins 34 which are in electrical communication with the lead frame 12, which therefore provide electrical communication between the components connected to the connectors 22,24,26,28,30 and the lead frame 12. Some of the connectors 20,22,24,26,28,30 have a greater number of pins (a high pin count), and other connectors 20,22,24,26,28,30 have a lesser number of pins (a low pin count), depending upon the use for the connectors 20,22,24,26,28,30.

The connectors 20,22,24,26,28,30 and leads 14 are used for connecting the assembly 10 to various components. In addition to having other types of interfaces than the connectors 20,22,24,26,28,30, the connectors 20,22,242,6,28,30 may be used for providing a connection between the lead frame 12, and various components such as sensors, solenoid, thermistors, and the like. In one embodiment, the lead frame assembly 10 is used as part of a transmission. Each of the leads 14 may be used for connection to a corresponding solenoid, and each of the first three connectors 20,22,24 may be used for connection with other parts of the transmission. Also, each of the remaining connectors 26,28,30,32 may be used to connect to components outside the transmission, such as an engine controller, a vehicle electronic control unit, or the like. Various components may also be mounted to the lead frame 12, such as resistors, capacitors, one or more inductors, or as shown in FIG. 2, a thermistor 36.

In one embodiment, the fourth connector 26 and the fifth connector 28 are grouped together as a cluster, shown generally at 38. The cluster 38 is connected to the lead frame 12 through the use of an extension 40. The extension 40 provides connection between the connectors 26,28 located in the second plane and the lead frame 12 located in the first plane. In other embodiments, the connectors 26,28 are not arranged in a cluster, but are located in separate locations, and there is a separate extension for each connector 26,28, which is used to connect each connectors 26,28 to the lead frame 12.

Various molding techniques may be used to integrally form the housing 16 with the lead frame 12. The housing 12 is molded around the lead frame 12, while still allowing the pins 34 and the leads 14 to remain exposed for connection with the various components as mentioned above. The lead frame 12 may also include die attach pads which are used for supporting the lead frame 12 during assembly.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An apparatus, comprising:
   a lead frame assembly, including:
   a lead frame located in a first plane;
   a housing substantially surrounding the lead frame;
   a plurality of connectors integral with the lead frame;
   a first connector connected to the lead frame;
   a second connector connected to the lead frame in proximity to the first connector; and
   a third connector connected to the lead frame in proximity to the first connector and the second connector;
   a fourth connector connected to the lead frame; and
   a fifth connector connected to the lead frame in proximity to the fourth connector;
   wherein the lead frame, the first connector, the second connector, and the third connector are located in the first plane, and the fourth connector and fifth connector are disposed in a second plane, the second plane being different from the first plane.

2. The apparatus of claim 1, the plurality of connectors further comprising a sixth connector connected to the lead frame facing a different direction compared to the first connector, the second connector, and the third connector, the sixth connector extending out of the first plane.

3. The apparatus of claim 2, the plurality of connectors further comprising a seventh connector disposed in the first plane, wherein the seventh connector faces a different direction in relation to the first connector, the second connector, and the third connector.

4. The apparatus of claim 1, further comprising a plurality of pins, each of the plurality of connectors having one or more of the plurality of pins exposed out of the housing for connection with other electrical components.

5. The apparatus of claim 1, further comprising a plurality of leads connected to the lead frame, each of the plurality of leads connected to a solenoid.

6. The apparatus of claim 1, each of the plurality of interfaces providing a connection between the lead frame and one or more selected from the group consisting of sensors, thermistors, solenoids, engine controllers, electronic control units, and combinations thereof.

7. The apparatus of claim 1, wherein one or more devices are directly connected to the lead frame in one of the first plane or the second plane.

8. The apparatus of claim 1, the one or more devices being one selected from the group consisting of sensors, thermistors, solenoids, engine controllers, electronic control units, and combinations thereof.

9. The apparatus of claim 1, the lead frame further comprising a single layer.

10. A lead frame assembly, comprising:
a lead frame;
a housing substantially surrounding the lead frame;
a plurality of connectors connected to the lead frame;
a first plane, at least a portion of the lead frame disposed in the first plane;
a second plane at a different location relative to the first plane, at least one of the plurality of connectors located in the second plane;
a first connector connected to the lead frame;
a second connector connected to the lead frame in proximity to the first connector;
a third connector connected to the lead frame in proximity to the first connector and the second connector;
a fourth connector connected to the lead frame; and
a fifth connector connected to the lead frame in proximity to the fourth connector;
wherein the first connector, the second connector, and the third connector are located in the first plane, and the fourth connector and the fifth connector are located in the second plane.

11. The lead frame assembly of claim 10, further comprising a sixth connector extending outwardly and away from the lead frame in a different direction compared to the first connector, the second connector, and the third connector, wherein the sixth connector extends out of the first plane.

12. The lead frame assembly of claim 10, further comprising a seventh connector disposed in the first plane, the seventh connector facing a different direction compared to the first connector, the second connector, and the third connector.

13. The lead frame assembly of claim 10, the plurality of connectors further comprising a plurality of pins exposed out of the housing, each of the plurality of pins operable for connection with external electrical components.

14. The lead frame assembly of claim 10, wherein the lead frame further comprises a single layer.

15. A lead frame assembly, comprising:
a lead frame made of a single layer;
a housing substantially surrounding the lead frame;
a plurality of leads formed as part of the lead frame;
a plurality of connectors;
a plurality of pins exposed outside of the housing for connection with electronic devices, each of the connectors having one or more of the plurality of pins;
a first connector connected to the lead frame;
a second connector connected to the lead frame in proximity to the first connector;
a third connector connected to the lead frame in proximity to the first connector and the second connector;
a fourth connector connected to the lead frame; and
a fifth connector connected to the lead frame in proximity to the fourth connector;
wherein the lead frame, the first connector, the second connector, and the third connectors are located in a first plane, and the fourth connector and fifth connector are disposed in a second plane, the second plane being different from the first plane.

16. The lead frame assembly of claim 15, the plurality of connectors further comprising a sixth connector extending outwardly away from the lead frame, and the sixth connector extends from the first plane.

17. The lead frame assembly of claim 15, the plurality of connectors further comprising a seventh connector disposed in the first plane, the seventh connector facing a different direction compared to the first connector, the second connector, and the third connector.

18. The lead frame assembly of claim 15, further comprising a plurality of leads connected to the lead frame, wherein each of the plurality of leads is connected to a solenoid.

\* \* \* \* \*